(12) United States Patent
Zijp (10) Patent No.: US 8,890,395 B2
(45) Date of Patent: Nov. 18, 2014

(54) BEAMSHAPING OPTICAL STACK, A LIGHT SOURCE AND A LUMINAIRE

(75) Inventor: Ferry Zijp, Nuenen (NL)

(73) Assignee: Koninklijke Philips N.V., Eindhoven (NL)

( * ) Notice: Subject to any disclaimer, the term of this patent is extended or adjusted under 35 U.S.C. 154(b) by 6 days.

(21) Appl. No.: 13/697,620

(22) PCT Filed: May 24, 2011

(86) PCT No.: PCT/IB2011/052250
§ 371 (c)(1),
(2), (4) Date: Nov. 13, 2012

(87) PCT Pub. No.: WO2011/148313
PCT Pub. Date: Dec. 1, 2011

(65) Prior Publication Data
US 2013/0057137 A1  Mar. 7, 2013

(30) Foreign Application Priority Data
May 28, 2010  (EP) ..................... 10164220

(51) Int. Cl.
| | | |
|---|---|---|
| *H01J 5/16* | (2006.01) | |
| *H01J 61/40* | (2006.01) | |
| *H01K 1/26* | (2006.01) | |
| *H01K 1/30* | (2006.01) | |
| *F21K 99/00* | (2010.01) | |
| *F21Y 105/00* | (2006.01) | |

(52) U.S. Cl.
CPC .............. *F21K 9/00* (2013.01); *F21Y 2105/008* (2013.01)
USPC ........... 313/110; 313/501; 313/504; 359/613; 362/326; 362/331; 362/339; 362/558

(58) Field of Classification Search
USPC ........... 313/110, 501, 504; 359/613; 362/326, 362/331, 339, 558
See application file for complete search history.

(56) References Cited

U.S. PATENT DOCUMENTS 3,739,217 A * 6/1973 Bergh et al. .................... 313/499
6,777,871 B2 * 8/2004 Duggal et al. ................. 313/506
(Continued)

FOREIGN PATENT DOCUMENTS

EP    1406474 A1    4/2004
EP    1420462 A1    5/2004
(Continued)

OTHER PUBLICATIONS

Yubao Wang et al; "Hybrid High Refractive Index Polymer Coatings", SPIE, vol. 5724, 2007, pp. 1-8.
(Continued)

*Primary Examiner* — Thomas A Hollweg
(74) *Attorney, Agent, or Firm* — Meenakshy Chakravorty (57) ABSTRACT

A beamshaping optical stack (108), a light source and a luminaire is provided. The beamshaping optical stack (108) is to be optically coupled to a light emitting surface of a light emitter. The beamshaping optical stack (108) comprises a first light transmitting layer (120) and a second light transmitting layer (118). The second light transmitting layer (118) comprises a first side (110) which is optically coupled to the first light transmitting layer (120) to receive light from the first light transmitting layer (120). The second light transmitting layer (118) further comprises a second side (106) which is substantially opposite the first side (110) to emit the received light into another optical medium. The second light transmitting layer (118) further comprises a geometrical structure (116) at the second side (106) to obtain a decreasing light emission with increasing light emission angles (9a) with respect to a normal (112) to the first side (110). The first light transmitting layer (120) is of a first material having a first refractive index. The second light transmitting layer (118) is of a second material having a second refractive index. The first refractive index is lower than the second refractive index.

14 Claims, 3 Drawing Sheets

(56) References Cited

U.S. PATENT DOCUMENTS

| | | | |
|---|---|---|---|
| 7,205,714 B2 * | 4/2007 | Chen | 313/504 |
| 7,582,358 B2 * | 9/2009 | Hayashi et al. | 428/447 |
| 7,646,143 B2 * | 1/2010 | Kimura | 313/501 |
| 7,834,542 B2 * | 11/2010 | Kitayama et al. | 313/504 |
| 2001/0026124 A1 * | 10/2001 | Liu et al. | 313/504 |
| 2001/0033135 A1 * | 10/2001 | Duggal et al. | 313/506 |
| 2001/0035713 A1 * | 11/2001 | Kimura | 313/501 |
| 2003/0127973 A1 * | 7/2003 | Weaver et al. | 313/504 |
| 2004/0012980 A1 * | 1/2004 | Sugiura et al. | 362/560 |
| 2004/0027062 A1 * | 2/2004 | Shiang et al. | 313/506 |
| 2004/0104672 A1 * | 6/2004 | Shiang et al. | 313/506 |
| 2004/0217702 A1 * | 11/2004 | Garner et al. | 313/512 |
| 2005/0007793 A1 * | 1/2005 | Yoshida et al. | 362/558 |
| 2005/0127542 A1 * | 6/2005 | Kaminsky et al. | 264/1.34 |
| 2005/0194896 A1 * | 9/2005 | Sugita et al. | 313/506 |
| 2005/0231101 A1 * | 10/2005 | Chen | 313/504 |
| 2006/0187552 A1 | 8/2006 | Huang et al. | |
| 2006/0197456 A1 | 9/2006 | Cok | |
| 2008/0074859 A1 * | 3/2008 | Kitayama et al. | 362/19 |
| 2008/0238310 A1 | 10/2008 | Forrest et al. | |

FOREIGN PATENT DOCUMENTS

| | | |
|---|---|---|
| JP | 2009211868 A | 9/2009 |
| WO | 2005083317 A1 | 9/2005 |
| WO | 2009005390 A1 | 1/2009 |
| WO | 2009087587 A1 | 7/2009 |

OTHER PUBLICATIONS

Hyouk Kwon et al; "Microlens Array Film With Full Fill Factor for Enhancing Outcoupling Efficiency From OLED Lighting", Solid-State Sensors, Actuator and Microsystems Conference 2007, IEEE Transducers & Durosensors, Jun. 10-14, 2007, pp. 1091-1094.

Huajun Peng et al; "Coupling Efficiency Enhancement in Organic Light-Emitting Devices Using Microlens Array—Theory and Experiment", Journal of Display Technologhy, vol. 1, No. 2, Dec. 2005, pp. 278-282.

* cited by examiner

BEAMSHAPING OPTICAL STACK, A LIGHT SOURCE AND A LUMINAIRE

FIELD OF THE INVENTION

The invention relates to optical stacks which provide beamshaping.

BACKGROUND OF THE INVENTION

Organic Light Emitting Devices (OLEDs) are Lambertian light emitters and, consequently, they emit light at all angles. When such Lambertian light emitters are used as lighting for a workspace, for example, at the ceiling of an office, glare may be become a problem. Glare is the sensation produced by bright areas within the field of view. The Lambertian light emitter may be seen directly within the field of view or may be seen as reflections, for example, on a computer display. Various national and international standards are defined to reduce the disadvantageous effect of glare. For example, a typical norm is that the light emitters, or luminaries comprising a light emitter, have to be designed to have a strong reduction of light emission at light emission angles higher than 60° such that not more than 1000 $cd/m^2$ is emitted at light emission angles larger than 65°. The light emission angle is defined with respect to a vertical axis.

In an article of Hyouk Kwon et. al., "Micro lens Array Film with Full fill factor for enhancing outcoupling efficiency from OLED lighting", Solid-State Sensors, Actuator and Microsystems Conference 2007 Transducers 2007 International, 10-14 Jun. 2007, pp 1091-1094, a solution for a better outcoupling of light from an OLED has been discussed. The article discloses a sheet with a Micro lens Array (MLA) that should be optically coupled to the light emitting surface of the OLED. The OLEDs with a MLA do not fulfill the typical glare norms.

In patent application WO2005/083317A1 is disclosed a translucent lighting panel which has at a light emitting surface protrusions of a specific shape which prevents the emission of light at relatively small angles to the plane of the panel and thus prevents glare. The protrusions have a pyramid shape or a conical shape. A surface of the translucent lighting panel, which is substantially opposite the light emitting surface, receives light from a light emitter and may be substantially flat.

Thus, it seems logical not to laminate the OLED with the MLA sheet of the cited article, but to laminate the OLED with the translucent lighting panel of the cited patent application in order to prevent glare and to obtain a better outcoupling of light. It is expected that the protrusions assist in the outcoupling of light, as the micro lenses do, and that the protrusions of the specific shape prevent the emission of light at relatively small angles to the plane of the panel. However, in evaluations it was found that the beamshaping effect of the sheet with protrusions of the specific shapes disappeared in this configuration and glare problems still exist with OLEDs laminated with the translucent lighting panel of the cited patent application.

SUMMARY OF THE INVENTION

It is an object of the invention to provide an optical structure for use with light emitters such that less light is emitted at relatively large light emission angles than at relatively small light emission angle. The light emission angles are defined with respect to the normal to the light emitting surface of the light emitter.

A first aspect of the invention provides a beamshaping optical stack as claimed in claim 1. A second aspect of the invention provides a light source as claimed in claim 11. A third aspect of the invention provides a luminaire as claimed in claim 15. Advantageous embodiments are defined in the dependent claims.

A beamshaping optical stack in accordance with the first aspect of the invention is to be optically coupled to a light emitting surface of a light emitter. The beamshaping optical stack comprises a first light transmitting layer and a second light transmitting layer. The second light transmitting layer comprises a first side which is optically coupled to the first light transmitting layer to receive light from the first light transmitting layer. The second light transmitting layer further comprises a second side which is substantially opposite the first side to emit the received light into another optical medium. The second light transmitting layer further comprises a geometrical structure at the second side to obtain a decreasing light emission with increasing light emission angles with respect to a normal to the first side. The first light transmitting layer is of a first material having a first refractive index. The second light transmitting layer is of a second material having a second refractive index. The first refractive index is lower than the second refractive index.

It is the insight of the inventor that the beamshaping effect of the second light transmitting layer is reduced when the light which is transmitted from the first side to the second side through the second light transmitting layer has a wide variety of light transmission angles with respect to the normal to the first side. The angle of the apex of a cone formed by the rays of the light transmitted from the first side to the second side should be limited in order to get a better beamshaping effect. This means that a maximum light transmission angle of light within the second light transmitting layer is limited. The light transmission angle is defined with respect to the normal to the first side. It is further noted that the invention is related to light which originates from a light emitter and is transmitted via the first light transmitting layer into the second light transmitting layer. This does not exclude that light from other light sources is also transmitted through the stack, for example, ambient light which enters the stack via the geometrical structure.

If light is transmitted from a first medium with a first refractive index into a second medium with a second refractive index being different from the first refractive index, the rays of light are refracted. If the refractive index of the first material is lower than the refractive index of the second material, light which is transmitted from the first light transmitting layer into the second light transmitting layer is refracted into the direction of the normal to the interface between the first light transmitting layer and the second light transmitting layer. Thus, the angle of the apex of a cone of ray angles of the light in the second light transmitting layer is reduced. Hence, the beamshaping effect of the second light transmitting layer is improved and less light is emitted into the another optical medium at relatively large angles with respect to the normal to the first side.

It is to be noted that an interface between the first light transmitting layer and the second light transmitting layer is relatively smooth. Thus, the first side of the second light transmitting layer is relatively smooth. Relatively smooth mean that the first side is without protrusions and recesses or roughness at a scale that causes scattering of light. In other words, interface and the first side may be described by a smooth function, which means that the function may be differentiated multiple times. It is to be noted that it does not mean that the interface and the first side are a flat plane—the interface and the first side may be slightly curved. If the interface and the first side are relatively smooth the light which is transmitted from the first refractive layer into the second refractive layer is refracted in a well-controlled manner without scattering and thus a well-defined cone of ray angles is obtained within the second light transmitting layer.

It is advantageous in the context of glare reduction if the beamshaping optical stack is used on the light emitting surface of a light source. The light emitting surface of such a light source may be relatively large. If the first light transmitting layer is optically coupled to the light emitting surface of the light source, the emission of light at light emission angles which form a relatively small angle with respect to the light emitting surface of the light source is avoided. Thus, the area light source may emit light at relatively high light intensities while at the same time the glare remains below the typical norms.

The first light transmitting layer and the second light transmitting layer may transmit light. Transmission of light means that at least a part of the light which enters the layer at a first side at least leaves the layer at a second side. Thus, the first light transmitting layer and/or the second light transmitting layer may be fully or partially translucent and/or fully or partially transparent. The second light transmitting layer has at the second side a geometric structure, which means that the second side is not a substantially flat surface and comprises a structure which may be described or defined by geometry.

The light which is emitted at the second side of the second light transmitting layer is emitted into the another optical medium. The another optical medium is the optical medium of the ambient of the beamshaping optical stack, and thus, in specific applications the another optical medium is the optical medium of the ambient of the beamshaping optical stack. If the combination of the light emitter and the beamshaping optical stack is used, for example, in an office environment, the another optical medium is air. However, embodiments of the another optical medium is no limited to air. If the combination of the light emitter and the beamshaping optical stack is used in submarine applications, the another optical medium may be water. Further, within the context of the invention the use of the term "emitting light" is not exclusively limited to light sources. Emitting light is used in the meaning of sending light forth. Thus, at the second side of the second light transmitting layer light is sent forth into the another optical medium.

The beamshaping optical stack may be a beamshaping optical foil, a beamshaping optical sheet, or a stack which is directly manufactured on top of the light emitting surface of a light source. The beamshaping optical foil may be manufactured by gluing a foil of the first material to a foil of the second material which comprises already at the second side the geometrical structure. The beamshaping optical sheet may be manufacture by optically coupling a sheet of the first material to a sheet of the second material, and subsequently stamping the geometrical structure into the second light transmitting layer. The stack may be manufactured directly on top of a light emitting surface of the light emitter by, for example, spin coating a layer of the first material on the light emitting surface of the light emitter, followed by spin coating the light emitter with a layer of the second material, and finally stamping the geometrical structure into the second side of the second light transmitting layer.

The beamshaping optical stack is relatively thin, which means that the thickness of the beamshaping optical stack, which is defined in a direction perpendicular to the first side, is smaller than the length and the width of the first side of the stack. Further, the beamshaping optical stack may be substantially flat, which means in the context of the invention, that the beamshaping optical stack may substantially follow an imaginary plane, but the beamshaping optical stack still has the geometrical structures at the second side. However, in other embodiments the beamshaping optical stack may be bent, for example, when applied to a light emitter which has a curved light emitting surface.

In an embodiment, the first light transmitting layer is in direct contact with the first side of the second light transmitting layer. In the context of this document, being in direct contact comprises at least the absence of an air gap between the first light transmitting layer and the first side of the second light transmitting layer. If the layers are in direct contact the optical coupling is optimal. However, an adhesive or a bonding layer may be provided in between the first light transmitting layer and the first side of the second light transmitting layer and also between the light emitting surface of the light emitter and the first light transmitting layer.

In another embodiment, a ratio between the second refractive index and the first refractive index is higher than 1.41. If the ratio is larger than 1.41, the cone of light transmission angles in the second light transmitting layer has a maximum light transmission angle of 45 degrees with respect to the normal to the first side. It was the insight of the inventors that the maximum light transmission angle of the cone of light transmission angles in the second light transmitting material should be not more than 45 degrees with respect to the normal to the first side to obtain an advantageous beamshaping of the light which is emitted into the ambient of the beamshaping optical stack at the second side of the second light transmitting layer.

In another embodiment, the first refractive index is lower than 1.4. A refractive index below 1.4 is a relatively low refractive index. If the first material has such a low refractive index it is relatively easy to find materials for the second material which have a higher refractive index and as such the angle of the apex of cone of light transmitting angles of the light transmitted from the first side to the second side is limited to a specific angle and a better beamshaping effect is obtained.

In an embodiment, the first material comprises amorphous fluoropolymers. Materials which comprise amorphous fluoropolymers have in general a relatively low refractive index. A relatively low refractive index is, as discussed previously, a refractive index which is lower than 1.4. It is to be noted that other materials may be comprised in the first light transmitting layer. The main characteristics of the first material in the context of the invention are that the first material is light transmitting and has a relatively low refractive index.

In another embodiment, the second refractive index is higher than 1.8. A refractive index above 1.8 is a relatively large refractive index. If the second material has such a refractive index, it is relatively easy to find materials for the first material which have a lower refractive index and as such the angle of the apex of cone of light transmitting angles of the light transmitted from the first side to the second side is limited to a specific angle and a better beamshaping is obtained.

In an embodiment, the second material comprises polymers comprising $TiO_2$ nanoparticles. Materials which comprise nanoparticles of the material $TiO_2$ have in general a relatively high refractive index. A relatively large refractive index is, as discussed previously, a refractive index which is higher than 1.8. It is to be noted that other materials may be comprised in the second light transmitting layer. The main characteristics of the second material in the context of the invention are that the second material is light transmitting and has a relatively large refractive index.

In an embodiment, the geometrical structure comprises protrusions which extend away from the second light transmitting layer and protrude into the another optical medium. If the geometrical structure comprises protrusions, the light which is transmitted into the another optical medium is mainly transmitted at angles which are relatively close to the normal to the first side. This prevents the disadvantageous effect of glare. It is to be noted that the geometrical structure may comprise a plurality of protrusions of which the base of each one of the protrusions touches the base of a number of neighboring protrusions such that the complete second side of the second light transmitting layer comprises protrusions. However, the protrusions may be arranged at the second side of the second light transmitting layer such that small spaces are present between the bases of the protrusions. In an advantageous embodiment a cross section of the base of a protrusion is not larger than 0.4×0.4 mm. If the protrusions are relatively small, the second light transmitting layer may be relatively thin, for example, thinner than 0.5 mm In a further embodiment, the protrusions have a substantially conical shape or a substantially pyramidal shape. The bases of the protrusions are closer to the first side than the apices of the protrusions. Protrusions of such a shape have been proven to provide an advantageous beamshaping effect such that it is prevented that light which is transmitted into the another optical medium is transmitted at relatively large angles with respect to the normal to the beamshaping optical stack. It is to be noted that the protrusions may have a shape which slightly differs from a pyramid or a cone. For example, the apex of the cone or pyramid may comprise a recess which extends into the protrusion. If the protrusions have a recess in the apex the beamshaping optical stack does not have sharp protrusions which are inconvenient when someone has to touch the second side of the beamshaping optical stack, and the second light transmitting layer may be thinner.

In a further embodiment, the cone apex angle of the protrusion is an angle in a range from 90° to 110°. In a practical embodiment the angle is in another range of 95° to 105°. Protrusions with such a cone apex angle provide a relatively good beamshaping effect when they are used in the second light transmitting layer with the relatively high refractive index.

In a further embodiment, the beamshaping optical stack further comprises one or more additional light transmitting layers which are interposed between the first light transmitting layer and the second light transmitting layer. The one or more additional layers allow the transmission of light from the first light transmitting layer towards the second light transmitting layer. The refractive indices of the one or more additional light transmitting layers are larger than the first refractive index and smaller than the second refractive index. In practical embodiments it is useful to interpose additional layers in between the first light transmitting layer and the second light transmitting layer. Such an additional layer may be a transparent adhesive, or a bonding layer, or in another embodiment a color filter which allows only the transmission of light in a range of specific wavelengths. If the refractive indices of the one or more additional layers are in a range which is limited by the first refractive index and the second refractive index, the effect of the reduction of the maximum light transmission angle within the second light transmitting is not reduced and thus the effect of glare reduction is still obtained. The maximum light transmission angle is defined with respect to the normal to the first side. The use of additional layers has the risk of additional absorption of light. As discussed previously, the interfaces between the layers of the stack may be relatively smooth to prevent undesired refractions and scattering of light.

According to a second aspect of the invention, a light source is provided which comprises a light emitter and the beamshaping optical stack of the first aspect of the invention. The first light transmitting layer of the beamshaping optical stack is optically coupled to the light emitting surface of the light emitter. The light source according to the second aspect of the invention has similar effects and embodiments as the beamshaping optical stack of the first aspect of the invention. A further effect of the combination of the beamshaping optical stack and the light emitter is a better outcoupling of light from the light emitter. Light emitters which have a light emitting surface do not emit all the light via the light emitting surface, because as the result of Total Internal Reflection (TIR) a part of the light is caught in the light emitter. If the light emitter is laminated with the beamshaping optical stack, the light emitting surface of the light emitter is not longer adjacent to air, but the light emitting surface is adjacent to a material which has most probably a refractive index which is higher than the refractive index of air, and as such less light is subject to TIR. Subsequently, the geometrical structure of the second light transmitting layer substantially outcouples a large fraction of the light which is received by the second light transmitting layer into the another optical medium.

In an embodiment, a first side of the first light transmitting layer is optically coupled to the second light transmitting layer and a second side of the first layer transmitting layer, which is substantially opposite the first side of the first layer transmitting layer, is optically coupled to the light emitting surface of the light emitter.

In an embodiment, the first light transmitting layer is in direct contact with the light emitting surface of the light emitter. As noted before, in direct contact means that no air gap is in between the light emitting surface and the first light transmitting layer. By means of a direct contact a better optical coupling is obtained.

In a further embodiment, the interface between the first light transmitting layer and the light emitting surface of the light emitter is structured or roughened to increase an outcoupling of light from the light emitter into the beamshaping optical stack. A structured or roughed interface is an interface of which sub-areas have a plurality of different angles with respect to a predefined reference axis. For example, the light emitting surface may comprise a plurality of protrusions and the first light transmitting layer has a plurality of recesses which receive the plurality of protrusions. Such an interface between two layers results in a better outcoupling of light from the light emitter.

In an embodiment, the light emitter is an Organic Light Emitting Device (OLED). An OLED is a substantial Lambertian light emitter. By laminating the OLED with the beamshaping optical stack, the combination of the OLED and the beamshaping optical stack emits a relatively small part of the emitted light at relatively large light emission angles with respect to the normal to the light emitting surface of the OLED. Further, an OLED is manufactured on a substrate, which is often glass and which often acts as the light exit window of the OLED, and thus a relatively large part of the light, which is generated in a light generation layer of the OLED, is caught in the OLED because of Total Internal Reflection (TIR) when the substrate is adjacent to air. By applying the beamshaping optical stack to the light emitting surface, a larger amount of light is outcoupled from the OLED into the beamshaping optical stack. It is to be noted that the best outcoupling is obtained if the first refractive index of the first light transmitting layer is substantially equal to or larger than the refractive index of the substrate on which the OLED is manufactured. However, the first refractive index has to be lower than the second refractive and as such it is expected that the first refractive index is lower than the refractive index of substrate and as such a sub-optimal outcoupling may be obtained. But, as long as the first refractive index is larger than 1, which is the refractive index of air, the outcoupling is still better than in the situation that the OLED emits the light into air.

According to a third aspect of the invention, a luminaire is provided which comprises the light source according to the second aspect of the invention. The luminaire provides similar embodiments as the light source and has similar effects as the embodiments of the light source according to the second aspect of the invention.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Modifications and variations of the light source and/or of the luminaire, which correspond to the described modifications and variations of the beamshaping optical stack, can be carried out by a person skilled in the art on the basis of the present description.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

Figure 1A:
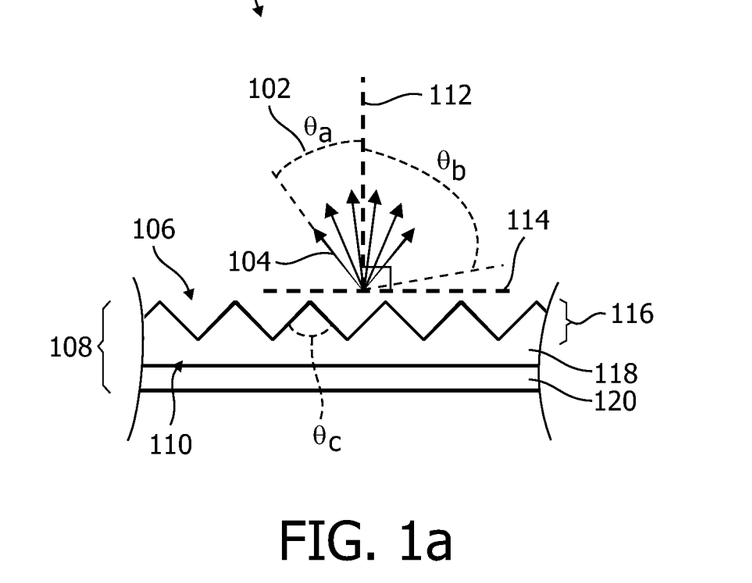
FIG. 1a schematically shows a cross section of an embodiment of a beamshaping optical foil, FIG. 1b schematically shows a cross section of another embodiment of the beamshaping optical foil, FIG. 2 schematically shows an embodiment of a light source.

A first embodiment of a beamshaping optical foil 100 is shown in FIG. 1. A stack 108 of first light transmitting layer 120 and a second light transmitting layer 118 form the beamshaping optical foil 100. The second light transmitting layer 118 has a first side 110 and a second side 106 substantially opposite the first side 110. The first side 110 is optically coupled to the first light transmitting layer 120. In the shown embodiment the first light transmitting layer 120 is in direct contact with the first side 110 of the second light transmitting layer 118, which means that the second light transmitting layer 118 is arranged on top of the first light transmitting layer 120. No air gap is in between the two layers 118, 120. The second light transmitting layer 118 may be attached to the first light transmitting layer 120 by means of a light transmitting adhesive. In other embodiments, the first light transmitting layer 120 may be manufactured on top of the first side 110 of the second light transmitting layer 118 by means of a deposition of a spinning process.

The first side 110 of the second light transmitting layer 118 and the first light transmitting layer are substantially flat. However, it is to be noted that in the figure the beamshaping optical foil 100 is shown as a foil which is parallel to an imaginary plane, however, the beamshaping optical foil may be bent, when the beamshaping optical foil is applied to a light source which has a curved light emitting surface. The second light transmitting layer 118 has at the second side 106 a geometric structure 116, which means that the second side 106 is not a substantially flat surface and comprises a structure which may be described or defined by geometrical formulas. In the example of FIG. 1 a cross section is shown and as such the saw tooth line which represents the geometrical structure 116 may be the cross section of a structure with repeating pyramids or a structure with repeating conical protrusions. Other geometrical structures may be possible as well as long as they assist in the beamshaping of the light which is emitted at the second side 106. The geometrical structure 116 prevents that light which is received by the second light transmitting layer 118 from the first light transmitting layer 120 is emitted into the ambient of the beamshaping optical foil 100 at emission angles which are relatively large. It has been proven that the geometrical structure 116 which has pyramids or protrusions of a conical shape with an apex angle $\theta_c$ which is in the range of 90° to 110° provide an advantageous beamshaping effect such that most of the light which is emitted at the second side 106 is only emitted at relatively small light emission angles $\theta_a$ and is not emitted or emitted at reduced intensity at relatively large light emission angles $\theta_b$.

The concept of the emission angle is illustrated at the top of the FIG. 1. An imaginary line 114 is drawn, which is substantially parallel to the beamshaping optical foil 100, in particular, which is substantially parallel to the first side 110 of the second light transmitting layer 118. A normal axis 112 to the imaginary line 114 is defined as the normal axis 112 to the beamshaping optical foil 100. The light emission angle of a specific light ray is the angle between the specific light ray and the normal axis 112.

The first light transmitting layer 120 is manufactured of a first material which transmits light and which has a first refractive index. Transmission of light means that at least a part of the light which enters the first light transmitting layer 120 at a first side at least leaves the first light transmission layer 120 at a second side. Thus, the first light transmitting layer 120 may be fully or partially translucent or fully or partially transparent. The second light transmitting layer 118 is manufactured of a second material which also transmits light and which has a second refractive index. The second refractive index has to be higher than the first refractive index. It is the insight of the inventors that the beamshaping effect of the second light transmitting layer 118 is only obtained if the light transmission angles of the light rays, which are transmitted through the second light transmitting layer 118, is limited to a relatively small cone. The light transmission angles are defined with respect to the normal axis 112. If the second refractive index is higher than the first refractive index the light rays which enters the second light transmitting layer 118 at the first side 110 are refracted such that an angle of an apex of the cone of light rays is limited. This is further discussed in the description of FIG. 2.

In an embodiment the first refractive index is smaller than 1.4 and the second refractive index is larger than 1.8. With such a difference between the refractive indices, the angle of the apex of light rays within the second light transmitting material 118 is relatively small. This results in an advantageous beamshaping effect.

In a further embodiment, the ratio between the second refractive index and the first refractive index fulfils the condition:

$$R = \frac{\text{second refractive index}}{\text{first refractive index}} > 1.41 \qquad (1)$$

If the ratio R has such a high value, the maximum light transmission angle of the cone of light rays within the second light transmitting material 118 is less than 45° with respect to a normal to the first side and as such the light which is emitted at the second side 106 into the ambient of the beamshaping optical foil 100 is only emitted at relatively small light emission angles with respect to the normal to the beamshaping optical foil 100.

The first light transmitting layer 120 comprises amorphous fluoropolymers. Such materials have a relatively low refractive index. Other materials may also be used in the first light transmitting layer as long as the first refractive index is relatively small. The second light transmitting material is a material with a relatively high refractive index. A high refractive index may be obtained by hybrid materials such as hybrid polyimides. In an embodiment, the material of the second light transmitting layer 118 comprises polymers and $TiO_2$ nanoparticles. Materials that comprise polymers and $TiO_2$ nanoparticles may have a refractive index which is higher than 1.8. By increasing the fraction of $TiO_2$ nanoparticles in the second light transmitting layer 118, the second refractive index may be increased.

In the example of FIG. 1a the beamshaping optical stack 108 is provided as a beamshaping optical foil 100. In other embodiments, the stack 108 may be provided as a sheet, or the stack 108 may be manufactured directly on top of a light emitting surface of a light emitter, for example, via spin coating the layers on the light emitter and stamping the geometrical structure in the second light transmitting layer.

Figure 1B:
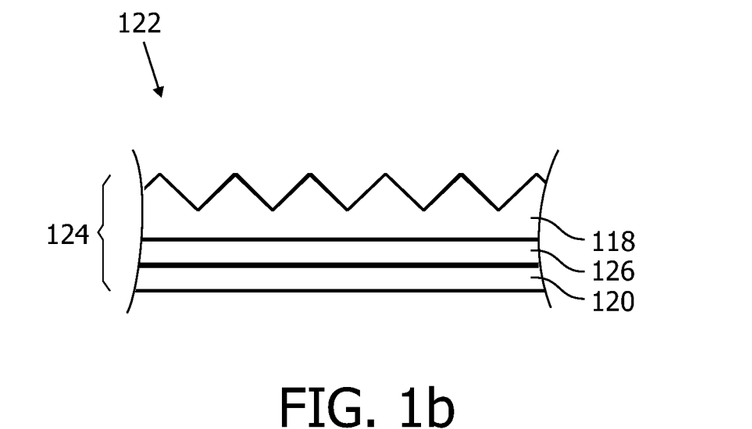

FIG. 1b provides another embodiment of a beamshaping optical foil 122. The beamshaping optical foil 122 comprises a beamshaping optical stack 124 of three layers, namely a first light transmitting layer 120, a second light transmitting layer 118 and a third light transmitting layer 126. The first light transmitting layer 120 and the second light transmitting layer 118 have characteristics as discussed previously in the context of FIG. 1a. The third light transmitting layer 126 is of a third material which has a third refractive index. The third refractive index is larger than the first refractive index and smaller than the second refractive index. Such a third material does not influence the advantageous beamshaping effect of the second light transmitting layer because, in the example of FIG. 1b, the limitation of the maximum light transmission angle of the cone of light transmission angles is performed in steps. A first limitation of the maximum light transmission angle a performed at an interface between the first light transmitting layer 120 and the third light transmitting layer 126, and a subsequent limitation of the maximum light transmission angle is obtained at an interface between the third light transmitting layer 126 and the second light transmitting layer 118.

Figure 2:
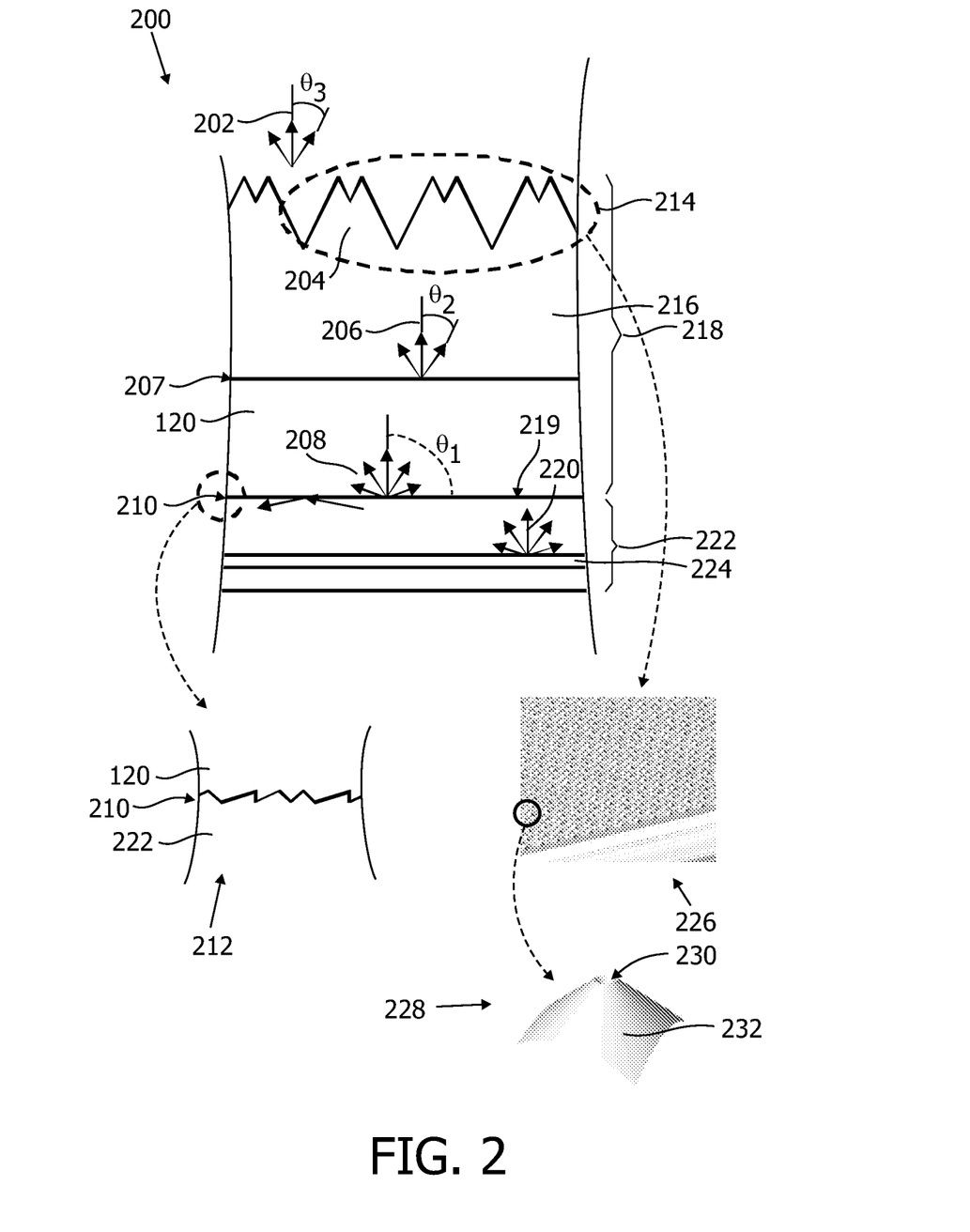

In FIG. 2 a cross section of a light source 200 is presented. The light source 200 comprises a light emitter 222, and a beamshaping optical foil 218 according to the first aspect of the invention. The beamshaping optical foil 218 comprises a first light transmitting layer 120 and a second light transmitting layer 216.

The light emitter 222 may be an Organic Light Emitting Diode (OLED) which comprises a light generation layer 224. Typical light generating layers emit light in all directions as shown with the light rays 220. Typical OLED devices are manufactured on a glass substrate which has also the function of the light exit window and as such the top surface of the substrate is the light emitting surface 219 of the light emitter 222. The light emitting surface 219 is in contact with the first light emitting layer 120 such that light from the light emitter 222 may enter the first light emitting layer 120. In the example of FIG. 2 it is assumed that the refractive index of the substrate of the light emitter 222 is higher than the first refractive index of the first light transmitting layer 120. In practical embodiments this is a valid assumption because the substrate is often made of glass which has a refractive index close to 1.5, or sometimes the substrate is a layer of sapphire which has a refractive index of 1.77. As discussed before, the refractive index of the first light transmitting layer 120 is lower than 1.4. Thus, at an interface 210 between the light emitting surface 219 and the first light transmitting layer 120 not all light generated by the light generation layer 224 is transmitted into the first light transmitting layer 120, and a part of the light is subject to Total Internal Reflection (TIR) and is thus caught within the light emitter 222. The light which is transmitted into the first light transmitting layer 120 is transmitted at substantially all light transmission angles as shown at 208. Thus, the maximum light transmission angle $\theta_1$ with respect to the normal to the interface 210 is large and most probably substantially equal to 90°.

Although not all the light which is generated in the light generation layer 224 is transmitted into the first light transmitting layer 120, a larger amount of light is transmitted into the first light transmitting layer than it would be transmitted if an air gap was present between the light emitter 222 and the first light transmitting layer 120, because the first refractive index is still higher than the refractive index of air. Thus, the first light transmitting layer 120 increases the outcoupling of light from the light transmitter 222. In order to increase the outcoupling of light, the interface 210 between the light emitter 222 and the first light transmitting layer 120 may be structured or roughened. This is shown in the detailed cross section 212 where a small part of the interface 210 is enlarged. In the example of 212 the interface 210 is roughened, which means that the interface has a sort of random pattern with protrusions and recesses. A structured interface is an interface of which the pattern of protrusions and recesses is a well-defined geometrical pattern.

In the embodiment of FIG. 2, the first light transmitting layer 120 is interposed between the light emitter 222 and the second light transmitting layer 216. The second light transmitting layer 216 is manufactured of a light transmitting medium which has a second refractive index. The second refractive index is higher than the first refractive index. Thus, all light which is transmitted at a plurality of light transmission angles from the light emitter 222 through the first light transmitting layer 120 towards an interface 207 between the first light transmitting layer 120 and the second light transmitting layer 222 is transmitted into the second light transmitting layer 222. At the interface 207 the light rays are refracted. And, as shown at 206, the maximum light transmission angle $\theta_2$ of the light rays inside the second light transmitting layer 216 with respect to a normal to the interface 207 is much smaller than the maximum light transmission angle $\theta_1$ of the light rays inside the first light transmitting layer 222.

As discussed before, the maximum light transmission angle $\theta_2$ should be limited such that the beamshaping effect of a geometrical structure 214 is not reduced.

The geometrical structure 214 comprises a repetition of a plurality of protrusions 204. A photograph 226 of the geometrical structure is presented. Further, a three dimensional view 228 of the protrusion 204 is shown in FIG. 2. The protrusion 204 has a substantially conically shaped surface 232 which tapers away from the base portion of the protrusion 204. The base portion is the part of the protrusion 204 which is closest to the first light transmitting layer 120. The protrusion extends away from the first light transmitting layer 120 and extends into another optical medium, which is in a practical example air. Extending away means that the base portion of the protrusion is closer to the first side than the top portion of the protrusion. As seen in the three dimensional view 228 the top portion of the protrusion 204 has a recess 230 which has the shape of a cone of which the top portion extends into the protrusion. In the presented cross section of the light source 200 the recess is also seen at the top of the protrusion 204. The geometrical structure 214, which has a plurality of the presented protrusions, emits the light into the ambient of the light source 200 at relatively small light emission angles close to the normal to light source 200 as shown at 202. The maximum light transmission angle $\theta_3$ is relatively small. It is at least smaller than the maximum light transmission angle $\theta_1$ of the light which enters the first light transmitting layer 120. The value of the maximum light emission angle $\theta_3$ is in a practical embodiment different from the maximum light emission angle $\theta_2$ of the light in the second light transmitting layer 216, however, the angle $\theta_3$ may be equal to the angle $\theta_2$.

The stack 218 is not necessarily a foil which is glued to the light emitting surface of the light emitter 222. In another embodiment the first light transmitting layer 120 is manufactured directly on the light emitter 222 by means of spin coating. Subsequently the second light transmitting layer 216 is also spin coated on top of the first light transmitting layer 120. Finally the geometrical structure 214 is stamped into the second light transmitting layer 216 by means of a roller which comprises a geometrical pattern which is the inverse of the geometrical structure 214.

Figure 3:
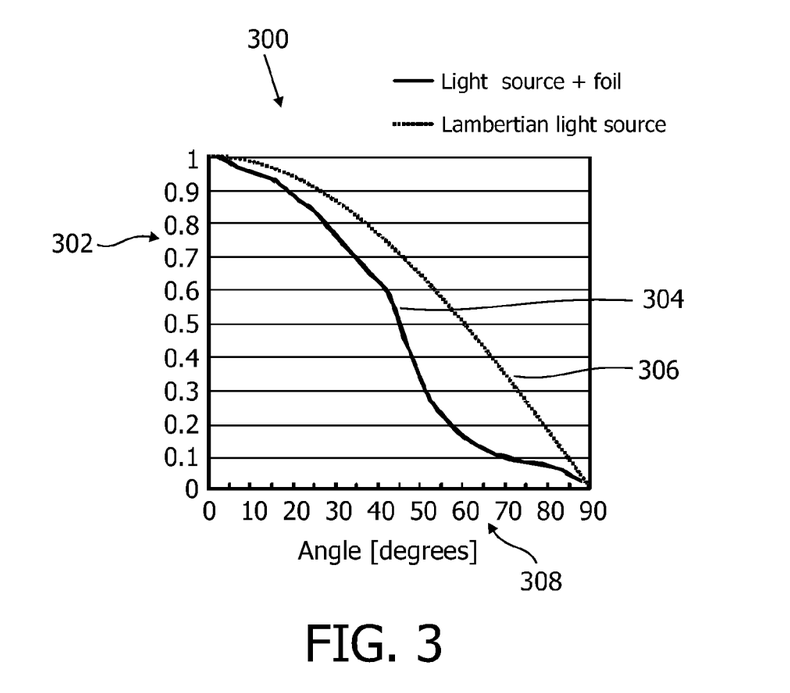
FIG. 3 shows a chart of a light emission profile of a light source according to the second aspect of the invention.

In FIG. 3 a chart 300 of distributions of the light emission angles by the light source 200 is presented. The x-axis 308 represents the light emission angle of light rays emitted by the light source 200 into the another optical medium. The light emission angle is defined with respect to a normal to the light source 200. The values of the y-axis 302 represent the normalized light intensity emitted by the light source 200 at a specific light emission angle. For reference, a light emission distribution 306 of a Lambertian light source is drawn. As seen, up to relatively large light emission angles the Lambertian light source emits a substantial amount of light. The solid line represents a light emission distribution 304 of the light source 200 of FIG. 2. As seen in FIG. 3 the light emission of the light source 200 strongly decreases at light emission angles which are higher than 50°. The typical glare norms require that at light emission angles which are equal to or larger than 65° is smaller than 1000 cd/m². The light source 200 has at 65° a normalized emitted light intensity of 0.13, and thus, the maximum emitted light intensity at 0° has to be smaller than 7690 cd/m². If the light source 200 is compared to the Lambertian light source, the Lambertian light source has at 65° a normalized light emission of 0.5, and thus, the light emission at 0° has to be lower than 2000 cd/m². Thus, the light source 200 may emit light at a relative high light intensity level at small light emission angles, while at the same time glare is prevented.

Figure 4:
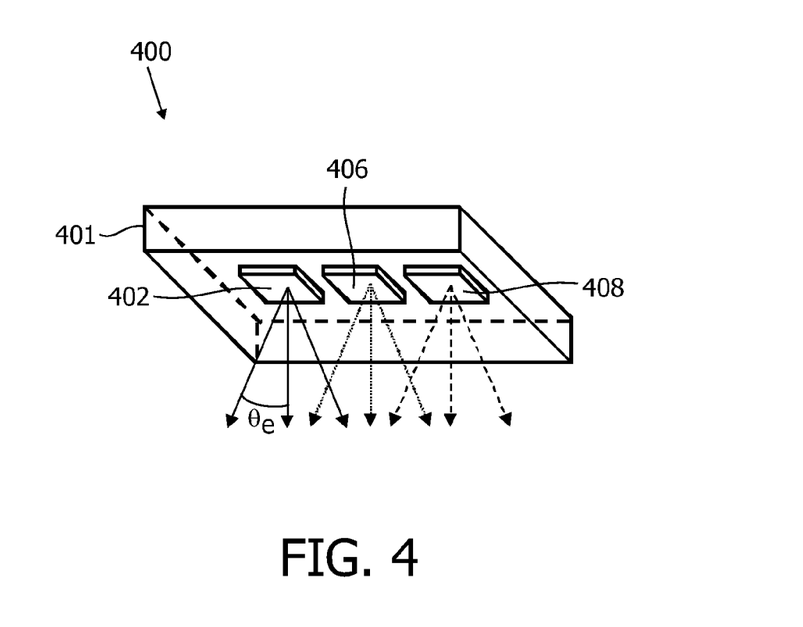
FIG. 4 shows an embodiment of a luminaire according to the third aspect of the invention.

FIG. 4 presents an embodiment of a luminaire 400 according to a third aspect of the invention. The luminaire 400 is suitable for use in, for example, an office. A housing 401 may be attached to a ceiling of the office. A plurality of light sources 402, 406, 408 according to the second aspect of the invention is provided inside the housing 401. It is to be noted that the luminaire may be provided with a single light source 402, with two light sources 406, 408, or even with more than three light sources. The light sources 402, 406, 408 transmit light at relatively small light transmission angles $\theta_c$ and as such, in offices which are provided with the luminaire 400, users do not experience much glare. Light source 402 may transmit the same color of light as the other two light sources 406, 408, and in another embodiment each one of the light sources 402, 406, 408 transmit another color of light.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention claimed is:

1. A beamshaping optical stack, comprising
   a first light transmitting layer of a first material having a first refractive index,
   a second light transmitting layer of a second material having a second refractive index, and
   one or more additional light transmitting layers of a third or more material interposed between the first light transmitting layer and the second light transmitting layer, wherein the one or more additional light transmitting layers allow the transmission of light from the first light transmitting layer towards the second light transmitting layer, and the refractive indices of the third or more material of the one or more additional light transmitting layers are larger than the first refractive index and smaller than the second refractive index,
   the second light transmitting layer comprising
      i) a first side being optically coupled to the first light transmitting layer for receiving light from the first light transmitting layer,
      ii) a second side being substantially opposite the first side for emitting the received light into another optical medium, and
      iii) a geometrical structure at the second side for obtaining a decreasing light emission with increasing light emission angles with respect to a normal to the first side, wherein the first refractive index is lower than the second refractive index.

2. A beamshaping optical stack according to claim 1, wherein a ratio between the second refractive index and the first refractive index is higher than 1.41.

3. A beamshaping optical stack according to claim 1, wherein the first refractive index is lower than 1.4.

4. A beamshaping optical stack according to claim 1, wherein the first material comprises amorphous fluoropolymers.

5. A beamshaping optical stack according to claim 1, wherein the second refractive index is higher than 1.8.

6. A beamshaping optical stack according to claim 1, wherein the second material comprises polymers comprising $TiO_2$ nanoparticles.

7. A beamshaping optical stack according to claim 1, wherein the geometrical structure comprises protrusions extending away from the second light transmitting layer.

8. A beamshaping optical stack according to claim 7, wherein the protrusions have a substantially conical shape or a substantially pyramidal shape, wherein the bases of the protrusions are closer to the first side than the apices of the protrusions.

9. A beamshaping optical stack according to claim 8, wherein the cone apex angle ($\theta_c$) of the protrusion is an angle in the range from 90° to 110°.

10. A light source comprising a light emitter and the beamshaping optical stack according to claim 1, wherein the first light transmitting layer of the beamshaping optical stack is optically coupled to the light emitting surface of the light emitter.

11. A light source according to claim 10, wherein the first light transmitting layer is in direct contact with the light emitting surface of the light emitter.

12. A light source according to claim 11, wherein the interface between the first light transmitting layer and the light emitting surface of the light emitter is structured or roughened for increasing an outcoupling of light from the light emitter into the beamshaping optical stack.

13. A light source according to claim 10, wherein the light emitter is an Organic Light Emitting Device.

14. A luminaire comprising the light source according to claim 10.

* * * * *